US010460965B2

(12) United States Patent
Kobayashi

(10) Patent No.: US 10,460,965 B2
(45) Date of Patent: Oct. 29, 2019

(54) SUSCEPTOR

(71) Applicant: BRIDGESTONE CORPORATION, Tokyo (JP)

(72) Inventor: Fumiya Kobayashi, Kodaira (JP)

(73) Assignee: MARUWA CO., LTD., Owariasahi, Aichi (JP)

( * ) Notice: Subject to any disclaimer, the term of this patent is extended or adjusted under 35 U.S.C. 154(b) by 0 days.

(21) Appl. No.: 14/914,728

(22) PCT Filed: Aug. 13, 2014

(86) PCT No.: PCT/JP2014/071377
§ 371 (c)(1),
(2) Date: Feb. 26, 2016

(87) PCT Pub. No.: WO2015/029786
PCT Pub. Date: Mar. 5, 2015

(65) Prior Publication Data
US 2016/0218024 A1    Jul. 28, 2016

(30) Foreign Application Priority Data

Aug. 29, 2013   (JP) ................................ 2013-177762

(51) Int. Cl.
*H05B 3/68* (2006.01)
*H01L 21/67* (2006.01)
(Continued)

(52) U.S. Cl.
CPC .... *H01L 21/67103* (2013.01); *C23C 16/4584* (2013.01); *H01L 21/68764* (2013.01);
(Continued)

(58) Field of Classification Search
CPC .......... C23C 16/4584; H01L 21/67103; H01L 21/68764; H01L 21/68771; H01L 21/68785; H01L 21/68792
(Continued)

(56) References Cited

U.S. PATENT DOCUMENTS 2,416,886 A * 3/1947 Stevens ................... B24B 41/04
310/66
6,492,625 B1   12/2002 Boguslayskiy et al.
(Continued)

FOREIGN PATENT DOCUMENTS

JP              6-20965 A       1/1994
JP           2004-513510 A       4/2004
(Continued)

OTHER PUBLICATIONS

International Search Report for PCT/JP2014/071377 dated Nov. 18, 2014.
(Continued)

*Primary Examiner* — Dana Ross
*Assistant Examiner* — Joseph Iskra
(74) *Attorney, Agent, or Firm* — Shumaker, Loop & Kendrick, LLP

(57) ABSTRACT

A bearing (12) being a recessed section that receives a spindle (20) is provided in a lower surface (10B) of a susceptor (10). The bearing (12) has a tapers from the lower surface (10B) towards an upper surface (10A). A gap (12B) is provided in an side wall (12A) of the bearing (12), further on the outside of the bearing (12) than a fitting surface (12X) between the bearing (12) and the spindle (20) in the horizontal direction. As a result, reduction in the fitting force between the susceptor bearing and the spindle can be suppressed and susceptor temperature reduction in the vicinity of the bearing can also be suppressed.

9 Claims, 3 Drawing Sheets

(51) Int. Cl.
*H01L 21/687* (2006.01)
*C23C 16/458* (2006.01)
(52) U.S. Cl.
CPC .. *H01L 21/68771* (2013.01); *H01L 21/68785* (2013.01); *H01L 21/68792* (2013.01)
(58) Field of Classification Search
USPC ............ 219/444.1; 118/728–732; 427/248.1; 204/192.2
See application file for complete search history.

(56) References Cited

U.S. PATENT DOCUMENTS

| | | | |
|---|---|---|---|
| 6,506,252 | B2 | 4/2003 | Boguslayskiy et al. |
| 6,547,876 | B2 | 4/2003 | Ferguson et al. |
| 9,230,846 | B2 | 1/2016 | Celaru et al. |
| 2002/0106826 | A1 | 8/2002 | Boguslayskiy et al. |
| 2003/0047132 | A1 | 3/2003 | Boguslayskiy et al. |
| 2003/0111009 | A1 | 6/2003 | Boguslayskiy et al. |
| 2009/0155028 | A1 | 6/2009 | Boguslayskiy et al. |
| 2011/0114022 | A1 | 5/2011 | Boguslayskiy et al. |
| 2011/0206843 | A1 | 8/2011 | Gurary et al. |
| 2011/0215071 | A1 | 9/2011 | Mitrovic et al. |
| 2011/0254236 | A1 | 10/2011 | Brugger et al. |
| 2011/0287635 | A1 | 11/2011 | Boguslayskiy et al. |
| 2011/0300297 | A1 | 12/2011 | Celaru et al. |

FOREIGN PATENT DOCUMENTS

| | | |
|---|---|---|
| JP | 2004-525056 A | 8/2004 |
| JP | 4159360 B2 | 7/2008 |
| JP | 2011-507266 A | 3/2011 |
| JP | 2013-526018 A | 6/2013 |
| JP | 2013531131 A | 8/2013 |
| WO | 97/09737 A1 | 3/1997 |
| WO | WO2009075747 * | 6/2009 |

OTHER PUBLICATIONS

International Searching Authority, Written Opinion for PCT/JP2014/071377 dated Nov. 18, 2014 [PCT/ISA/237].
Search report from communication dated May 2, 2017 from the State Intellectual Property Office of the P.R.C. in counterpart Application No. 2014800478469.
Communication dated Mar. 15, 2016, from the Japanese Patent Office in counterpart application No. 2013-177762.
"Taper Grinding", High Precision Parts/Trial Models/Jigs and Fixtures: M1—Seiko Co., LTD., http://m1-seiko.sakura.ne.jp/products_taper_e.html, retrieved Nov. 16, 2018, pp. 1-2 (4 pages total).
"Advantages of Taper Fitting", High Precision Taper Grinding Products: M1 Seiko Co., Ltd., http://m1-seiko.sakura.ne.jp/craftsmanship_taper_e.html, retrieved Nov. 16, 2018, pp. 1-2 (5 pages total).

* cited by examiner

SUSCEPTOR

CROSS REFERENCE TO RELATED APPLICATIONS

This application is a National Stage of International Application No. PCT/JP2014/071377 filed Aug. 13, 2014, claiming priority based on Japanese Patent Application No. 2013-177762, filed Aug. 29, 2013, the contents of all of which are incorporated herein by reference in their entirety.

TECHNICAL FIELD

The present invention relates to a susceptor provided with a base member having a recessed portion.

BACKGROUND ART

Conventionally, in performing treatment where a film made of silicon carbide, gallium arsenite, a composite metal oxide (for example, $YBa_2Cu_3O_7$) or the like is formed on a surface of a wafer, a wafer holder for holding the wafer (hereinafter referred to as "susceptor") is used.

Here, as a reactor which houses the susceptor, there has been known a vertical-type reactor which is configured such that a reactive gas flows from an upper direction to a lower direction, and the susceptor is rotated at a high speed about a rotary shaft (spindle) along a vertical direction. The susceptor is provided with a bearing which receives the spindle, and the susceptor is fitted on the spindle due to its own weight (see Patent Literature 1, for example).

CITATION LIST

Patent Literature

Patent Literature 1: JP 2004-525056 A

SUMMARY OF INVENTION

Technical Problem

In the above-mentioned configuration, the susceptor rotates at a high speed and hence, a fitting strength between the bearing of the susceptor and the spindle is important. On the other hand, in view of the transfer of heat from the susceptor to the spindle, it is also necessary to take into account lowering of a temperature of the susceptor in the vicinity of the bearing.

The present invention has been made to overcome the above-mentioned problem, and it is an object of the present invention to provide a susceptor which can suppress lowering of a temperature of the susceptor in the vicinity of the bearing while suppressing lowering of a fitting strength between a bearing of the susceptor and a spindle.

Solution to Problem

A susceptor according to a first aspect has an upper surface on which a wafer is placed and a lower surface arranged on a side opposite to the upper surface, and configured to be rotated about a spindle which extends in a vertical direction. A bearing formed of a recessed section receiving the spindle is formed on the lower surface. The bearing has a shape where the bearing is tip-narrowed toward the upper surface from the lower surface. A gap is formed in an side wall of the bearing such that the gap projects toward the outside of the bearing from a fitting surface between the bearing and the spindle in a horizontal direction perpendicular to the vertical direction.

The gap may project more toward the outside of the bearing than an opening portion formed on a lowermost end of the bearing in a horizontal direction.

A bottom surface corresponding to a upper end surface of the bearing may have a convex shape projecting downward.

A bottom surface corresponding to a upper end surface of the bearing may have a concave shape recessed upward.

Advantageous Effects of Invention

The present invention provides a susceptor which can suppress lowering of a temperature of the susceptor in the vicinity of the bearing while suppressing lowering of a fitting strength between a bearing of the susceptor and a spindle.

DESCRIPTION OF EMBODIMENTS

Hereinafter, a susceptor according to an embodiment of the present invention will be described with reference to the drawings. Note that, in the following description of the drawings, same or similar reference signs denote same or similar elements and portions.

It is to be noted that the drawings are schematic and the dimensions or ratios are different from actual values. Accordingly, specific dimensions and the like should be determined by taking the following description into consideration. Needless to say, a relationship or a ratio of mutual dimensions may differ among the drawings.

SUMMARY OF EMBODIMENT

The susceptor according to the embodiment has an upper surface on which a wafer is placed and a lower surface arranged on a side opposite to the upper surface, and is configured to be rotated about a spindle which extends in a vertical direction. A bearing which is a recessed portion for receiving the spindle is formed on the lower surface. The bearing has a shape where the bearing is tip-narrowed toward the upper surface from the lower surface, that is, a tapered shape. A gap is formed in an side wall of the bearing such that the gap projects toward the outside of the bearing from a fitting surface between the bearing and the spindle in a horizontal direction perpendicular to the vertical direction.

In this embodiment, the bearing has the shape where the bearing is tip-narrowed toward the upper surface from the lower surface, that is, a tapered shape. Accordingly, lowering of a fitting strength between the bearing of the susceptor and the spindle can be suppressed. On the other hand, on the side wall of the bearing, the gap is formed more outside of the bearing than the fitting surface between the bearing and the spindle in the horizontal direction. Accordingly, a contact area between the bearing and the spindle is decreased and hence, the transfer of heat from the susceptor to the spindle can be suppressed whereby lowering of a temperature of the susceptor in the vicinity of the bearing can be suppressed.

First Embodiment (Configuration of Susceptor)

Figure 1:
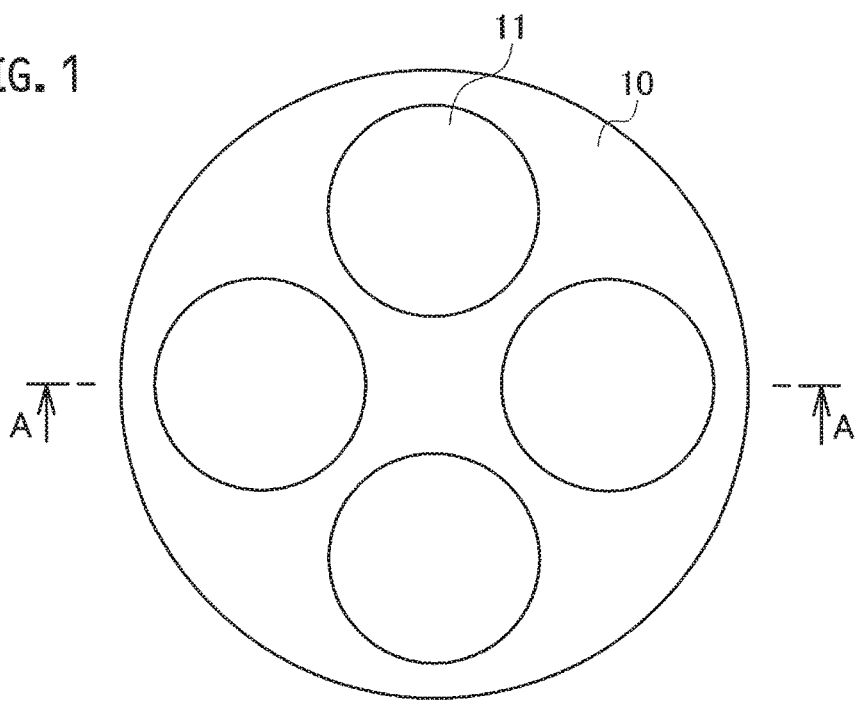
FIG. 1 is a view illustrating a susceptor 10 according to a first embodiment of the present invention.
Figure 2:
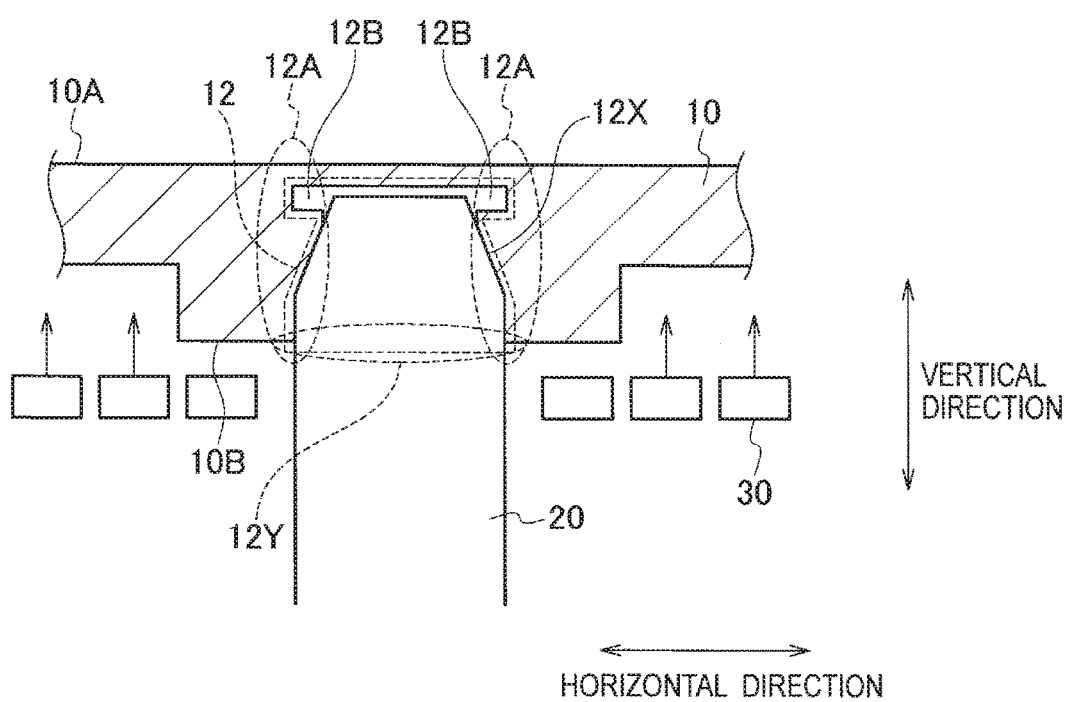
FIG. 2 is a view illustrating the susceptor 10 according to the first embodiment of the present invention.

Hereinafter, a susceptor according to a first embodiment is described. FIG. 1 and FIG. 2 are views showing the susceptor 10 according to the first embodiment. FIG. 1 is a view showing a main surface (upper surface) of the susceptor 10. FIG. 2 is a view schematically showing a portion of a cross section (cross section taken along a line A-A) of the susceptor 10.

As shown in FIG. 1 and FIG. 2, the susceptor 10 has an upper surface 10A on which a wafer is placed, and a lower surface 10B arranged on a side opposite to the upper surface 10A. The susceptor 10 is configured to be rotated about a spindle 20 (rotary shaft) extending along a vertical direction. The susceptor 10 is configured to be heated by a heater 30 from a side of the lower surface 10B.

The susceptor 10 is made of a carbon base material. The susceptor 10 may not be covered by a SiC film or the like. The susceptor 10 may be made of quartz glass. The susceptor 10 may have a circular disc shape, for example.

Recessed portions 11 respectively holding a wafer are formed on the upper surface 10A. Since the movement of the wafer is suppressed by a side wall of the recessed portion 11, even when the susceptor 10 is rotated, the wafers are held on the upper surface 10A.

A bearing 12 which is a recessed portion for receiving the spindle 20 is formed on the lower surface 10B. The bearing 12 has a shape where the bearing 12 is tip-narrowed from the lower surface 10B to the upper surface 10A, that is, a tapered shape. In other words, the bearing 12 has a tapered shape corresponding to a distal end portion of the spindle 20.

The spindle 20 is made of metal having higher thermal conductivity than a material for forming the susceptor 10, for example. The spindle 20 has a shape where the spindle 20 is gradually narrowed toward a distal end of the spindle 20, that is, a tapered shape. For example, the spindle 20 has a circular columnar shape, and a distal end portion of the spindle 20 has a tapered conical trapezoidal shape, that is, a frustoconical shape.

As described above, the bearing 12 has a shape corresponding to the distal end of the spindle 20. By inserting the spindle 20 into the bearing 12, the spindle 20 is fitted in the bearing 12. The susceptor 10 is fitted on the spindle 20 by the own weight of the susceptor 10. Ideally, it is preferable that the bearing 12 and the distal end of the spindle 20 have shapes which completely correspond to each other. However, from a viewpoint of a problem on working accuracy of the bearing 12 or the like, there may be a case where it is difficult to apply working to the bearing 12 and the spindle 20 such that the shape of the bearing 12 and the shape of distal end portion of the spindle 20 completely correspond to each other. In such a case, it is preferable to make the size of the bearing 12 and the size of the distal end portion of the spindle 20 completely agree with each other on a lower end side of the bearing 12 (large end fitting).

Although the heater 30 is not particularly limited, for example, the heater 30 is formed of an electrically-heated wire having a vortex-shaped pattern.

In the first embodiment, a gap 12B is formed in the side wall 12A of the bearing 12 such that the gap 12B projects toward the outside of the bearing 12 from a fitting surface 12X between the bearing 12 and the spindle 20 in a horizontal direction perpendicular to a vertical direction. In this embodiment, the fitting surface 12X indicates a surface of the side wall 12A of the bearing 12 which is in contact with the spindle 20. From a viewpoint of fitting strength between the susceptor 10 (bearing 12) and the spindle 20, it is preferable that the side wall 12A (fitting surface 12X) of the bearing 12 be a flat surface.

It is preferable that the gap 12B project more toward the outside of the bearing 12 than an opening portion 12Y formed on a lowermost end of the bearing 12 in a horizontal direction. Further, it is preferable that the gap 12B be formed on an uppermost end (bottom surface side) of the bearing 12. It is preferable that the gap 12B project in all azimuths in the horizontal direction. That is, the gap 12B has a circular annular shape around the spindle 20.

(Operation and Advantageous Effects)

In the first embodiment, the bearing 12 has the shape where the bearing 12 is tip-narrowed toward the upper surface 10A from the lower surface 10B, that is, a tapered shape. Accordingly, lowering of a fitting strength between the bearing 12 of the susceptor 10 and the spindle 20 can be suppressed. On the other hand, the gap 12B is formed in the side wall 12A of the bearing 12 such that the gap 12B projects toward the outside of the bearing 12 from the fitting surface 12X between the bearing 12 and the spindle 20 in the horizontal direction. Accordingly, a contact area between the bearing 12 and the spindle 20 is decreased and hence, the transfer of heat from the susceptor 10 to the spindle 20 can be suppressed whereby lowering of a temperature of the susceptor 10 in the vicinity of the bearing 12 can be suppressed.

First Modification

A first modification of the first embodiment is described hereinafter. The description is made hereinafter mainly with respect to points which make the first modification differ from the first embodiment.

Figure 3:
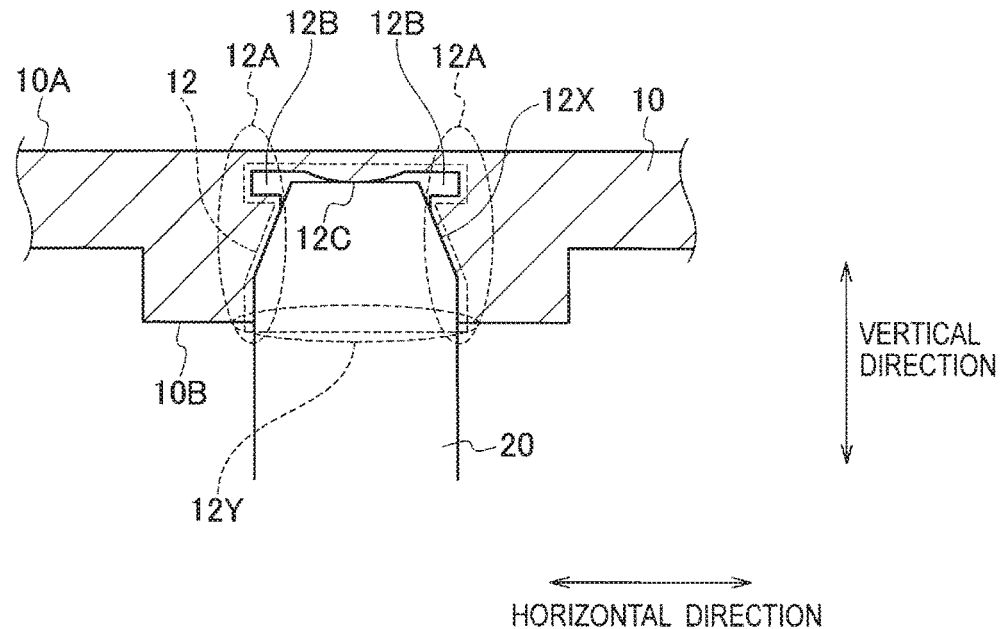
FIG. 3 is a view illustrating the susceptor 10 according to a first modification of the present invention.

Although not particularly described in the first embodiment, in the first modification, as shown in FIG. 3, a bottom surface 12C of a bearing 12 has a convex shape projecting downward. With such a configuration, even when an upper end surface of the spindle 20 reaches the bottom surface 12C, a contact area between the upper end surface of the spindle 20 and the bottom surface 12C is decreased and hence, the transfer of heat from the susceptor 10 to the spindle 20 can be suppressed. Since the upper end surface of the spindle 20 reaches the bottom surface 12C, the rotation of the susceptor 10 becomes stable.

Second Modification

A second modification of the first embodiment is described hereinafter. The description is made hereinafter mainly with respect to points which make the second modification differ from the first embodiment.

Figure 4:
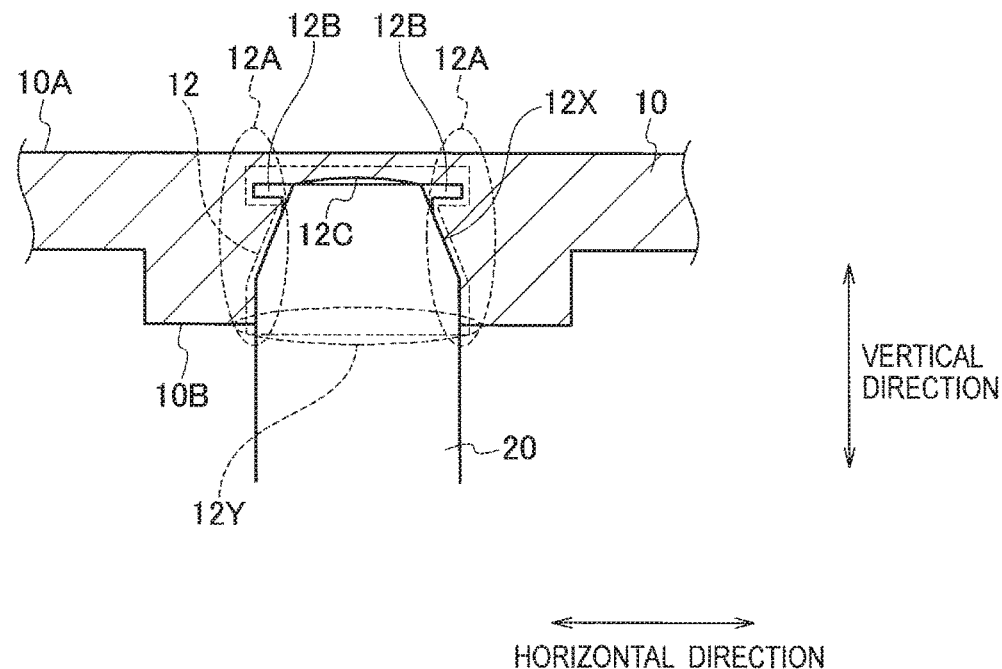
FIG. 4 is a view illustrating the susceptor 10 according to a second modification of the present invention.

Although not particularly described in the first embodiment, in the second modification, as shown in FIG. 4, a bottom surface (upper end surface) 12C of a bearing 12 has a concave shape recessed upward. With such a configuration, even when an upper end surface of the spindle 20 reaches the bottom surface 12C, a contact area between the upper end surface of the spindle 20 and the bottom surface 12C is decreased and hence, the transfer of heat from the susceptor 10 to the spindle 20 can be suppressed. Since the upper end surface of the spindle 20 reaches the bottom surface 12C, the rotation of the susceptor 10 becomes stable.

Third Modification

A third modification of the first embodiment is described hereinafter. The description is made hereinafter mainly with respect to points which make the third modification differ from the first embodiment.

Figure 5:
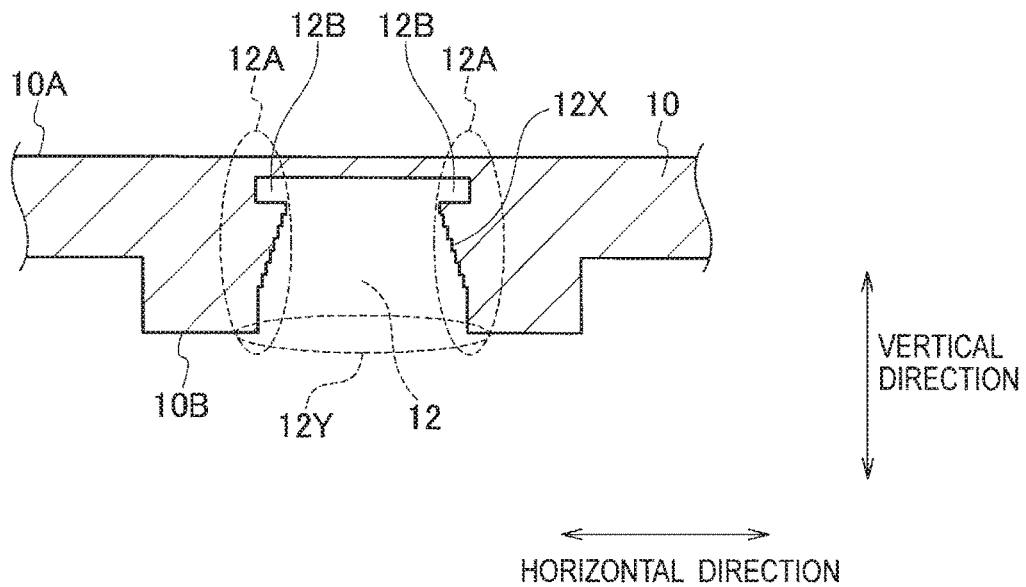
FIG. 5 is a view illustrating the susceptor 10 according to a third modification of the present invention.
Figure 6:
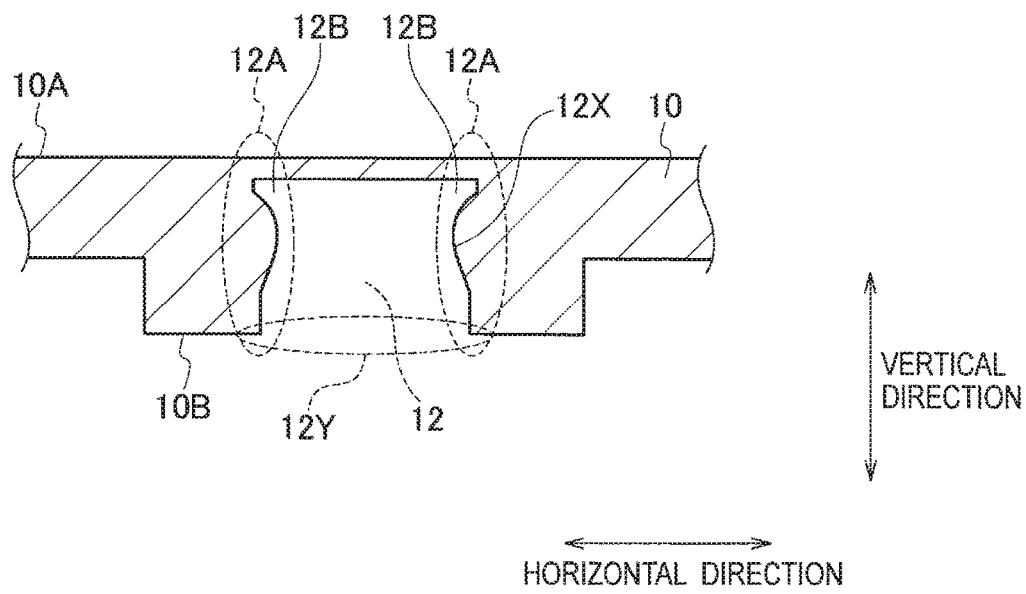
FIG. 6 is a view illustrating the susceptor 10 according to another third modification of the present invention.

In the first embodiment, the side wall 12A of the bearing 12 is a flat surface. However, the embodiment is not limited to such a configuration. To be more specific, the side wall 12A of the bearing 12 may have a stepped shape as shown in FIG. 5. Alternatively, as shown in FIG. 6, the side wall 12A of the bearing 12 may have a convex shape which projects toward the inside of the bearing 12.

Other Embodiments

Although the present invention has been described in conjunction with the above-mentioned embodiments, it should not be construed that the description and the drawings which form a part of this disclosure limit the present invention. Various substitute embodiments, examples and techniques to carry out the present invention will become apparent to those who are skilled in the art from this disclosure.

In this embodiment, the gap 12B is formed on the uppermost end (bottom surface side, that is, the upper end surface side) of the bearing 12. However, the embodiment is not limited to such a configuration. The gap 12B may be formed in the middle portion between the lowermost end of the bearing 12 and the uppermost end of the bearing 12.

In this embodiment, the gap 12B projects in all azimuths in a horizontal direction. However, the embodiment is not limited to such a configuration. The gap 12B may project in only some azimuths in the horizontal direction.

Although not particularly described in the embodiment, it is sufficient that the fitting surface 12X between the bearing 12 and the spindle 20 account for 80% or more of an area of a portion of a side surface of the spindle 20 inserted into the inside of the bearing 12. In other words, it is sufficient that the gap 12B have a size which satisfies such a condition.

In this embodiment, the distal end portion of the spindle 20 has a tapered conical trapezoidal shape, that is, a frustoconical shape, and the bearing 12 has a shape corresponding to the distal end portion of the spindle 20. However, the distal end portion of the spindle 20 may have a tapered triangular pyramidal trapezoidal shape, that is, a triangular frustopyramidal shape or a tapered pyramidal trapezoidal shape, that is, a frustopyramidal shape. In such cases, it is needless to say that the bearing 12 has a shape corresponding to the distal end portion of the spindle 20.

It should be noted that the present application claims priority to Japanese Patent Application No. 2013-177762, filed on Aug. 29, 2013, the entire contents of which are incorporated by reference herein.

REFERENCE SIGNS LIST

10 SUSCEPTOR
11 RECESSED PORTION
12 BEARING
12A SIDE WALL
12B GAP
12C BOTTOM SURFACE (UPPER END SURFACE)
12X FITTING SURFACE
12Y OPENING PORTION
20 SPINDLE
30 HEATER

The invention claimed is:

1. A susceptor having an upper surface on which a wafer is placed and a lower surface arranged on a side opposite to the upper surface, and configured to be rotated about a spindle which extends in a vertical direction, wherein:
   a bearing formed of a recessed section receiving the spindle is formed on the lower surface,
   the bearing has a shape where the bearing is tip-narrowed toward the upper surface from the lower surface, and
   a gap is formed in a side wall of the bearing such that the gap projects toward the outside of the bearing from a fitting surface between the bearing and the spindle in a horizontal direction perpendicular to the vertical direction,
   wherein the fitting surface between the bearing and the spindle accounts for 80% or more of an area of a portion of a side surface of the spindle inserted into the bearing,
   wherein a distal end portion of the spindle has a tapered shape, and
   wherein the spindle engages the bearing at a downstream end of the distal end portion of the spindle where a size of the spindle agrees with a size of the bearing,
   wherein the spindle is made of metal having higher thermal conductivity than a material of the susceptor.

2. The susceptor according to claim 1, wherein the gap projects more toward the outside of the bearing than an opening portion formed on a lowermost end of the bearing in a horizontal direction.

3. The susceptor according to claim 1, wherein a bottom surface of the bearing has a convex shape projecting downward.

4. The susceptor according to claim 1, wherein a bottom surface of the bearing has a concave shape recessed upward.

5. The susceptor according to claim 1, wherein the gap is formed at an uppermost end of the bearing.

6. The susceptor according to claim 1, wherein the gap projects in all azimuths in a horizontal direction.

7. The susceptor according to claim 1, wherein the gap has a circular annular shape around the spindle.

8. The susceptor according to claim 1, wherein the bearing has a frustoconical shape as the tapered shape.

9. The susceptor according to claim 1, wherein the susceptor is constituted by a single member.

* * * * *